(12) United States Patent
Lim et al.

(10) Patent No.: US 11,236,430 B2
(45) Date of Patent: Feb. 1, 2022

(54) COATED WIRE

(71) Applicant: Heraeus Materials Singapore Pte. Ltd., Singapore (SG)

(72) Inventors: Yee Weon Lim, Kuala Lumpur (MY); Xi Zhang, Thomson (SG); Senthil Kumar Balasubramanian, Singapore (SG); Suat Teng Tan, Singapore (SG); Jin Zhi Liao, Singapore (SG); Dan Su, Singapore (SG); Chee Wei Tok, Singapore (SG); Murali Sarangapani, Singapore (SG); Jurgen Scharf, Mombris (DE)

(73) Assignee: HERAEUS MATERIALS SINGAPORE PTE. LTD., Singapore (SG)

( * ) Notice: Subject to any disclaimer, the term of this patent is extended or adjusted under 35 U.S.C. 154(b) by 381 days.

(21) Appl. No.: 16/312,703

(22) PCT Filed: Aug. 18, 2017

(86) PCT No.: PCT/SG2017/000008
§ 371 (c)(1),
(2) Date: Dec. 21, 2018

(87) PCT Pub. No.: WO2018/048344
PCT Pub. Date: Mar. 15, 2018

(65) Prior Publication Data
US 2021/0222313 A1    Jul. 22, 2021

(30) Foreign Application Priority Data
Sep. 9, 2016 (SG) ............................ 10201607523R

(51) Int. Cl.
*C25D 5/10* (2006.01)
*C25D 3/46* (2006.01)
(Continued)

(52) U.S. Cl.
CPC .................. *C25D 5/10* (2013.01); *C25D 3/46* (2013.01); *C25D 5/48* (2013.01); *C25D 7/0607* (2013.01);
(Continued)

(58) Field of Classification Search
CPC ... C25D 5/10; C25D 3/46; C25D 5/48; C25D 7/0607; C25D 7/06; C23C 30/00;
(Continued)

(56) References Cited

U.S. PATENT DOCUMENTS 5,510,197 A * 4/1996 Takahashi ......... H01L 23/49582
428/670
7,638,035 B2 12/2009 Sasaki et al.
(Continued)

FOREIGN PATENT DOCUMENTS

CN 103184362 A 7/2013
EP 1677345 A1 7/2006
(Continued)

OTHER PUBLICATIONS

International Search Report for PCT/SG2017/000008, dated Nov. 21, 2017. (Year: 2017).*
(Continued)

*Primary Examiner* — Douglas J McGinty
(74) *Attorney, Agent, or Firm* — Blank Rome LLP

(57) ABSTRACT

A wire comprising a wire core with a surface, the wire core having a coating layer superimposed on its surface, wherein the wire core itself consists of:
(a) pure silver consisting of (a1) silver in an amount in the range of from 99.99 to 100 wt.-% and (a2) further components in a total amount of from 0 to 100 wt-ppm
or
(b) doped silver consisting of (b1) silver in an amount in the range of from >99.49 to 99.997 wt.-%, (b2) at least one doping element selected from the group consisting of calcium, nickel, platinum, palladium, gold, copper, rhodium and ruthenium in a total amount of from 30 to <5000 wt.-ppm and (b3) further components in a total amount of from 0 to 100 wt.-ppm,
or
(c) a silver alloy consisting of (c1) silver in an amount in the range of from 89.99 to 99.5 wt.-%, (c2) at least one alloying element selected from the group consisting of nickel, platinum, palladium, gold, copper, rhodium and ruthenium in a total amount in the range of from 0.5 to 10 wt.-% and (c3) further components in a total amount of from 0 to 100 wt.-ppm,
or
(d) a doped silver alloy consisting of (d1) silver in an amount in the range of from >89.49 to 99.497 wt.-%, (d2) at least one doping element selected from the group consisting of calcium, nickel, platinum, palladium, gold, copper, rhodium and ruthenium in a total amount of from 30 to <5000 wt.-ppm, (d3) at least one alloying element selected from the group consisting of nickel, platinum, palladium, gold, copper, rhodium and ruthenium in a total amount in the range of from 0.5 to 10 wt.-% and (d4) further components in a total amount of from 0 to 100 wt.-ppm,
wherein the at least one doping element (d2) is other than the at least one alloying element (d3),
wherein the individual amount of any further component is less than 30 wt.-ppm,
wherein the individual amount of any doping element is at least 30 wt.-ppm,
wherein all amounts in wt.-% and wt.-ppm are based on the total weight of the core, and
wherein the coating layer is a double-layer comprised of a 1 to 1000 nm inner layer of gold and an adjacent 0.5 to 100 nm thick outer layer of palladium or a double-layer comprised of a 0.5 to 100 nm thick inner layer of palladium and an adjacent >200 to 1000 nm thick outer layer of gold.

14 Claims, No Drawings

(51) Int. Cl.
*C25D 5/48* (2006.01)
*C25D 7/06* (2006.01)
*H01B 13/32* (2006.01)
*H01B 13/02* (2006.01)
*H01B 1/02* (2006.01)

(52) U.S. Cl.
CPC ............... *H01B 1/02* (2013.01); *H01B 13/02* (2013.01); *H01B 13/32* (2013.01)

(58) Field of Classification Search
CPC .......... C22C 5/06; H01B 13/32; H01B 13/02; H01B 1/02; B23K 35/0222; B23K 35/0255; B23K 35/0272; B23K 35/3006; B23K 35/0227; B23K 35/0261; H01L 2224/85045; H01L 2224/45015; H01L 2224/45139; H01L 2224/45565; H01L 2224/45572; H01L 2224/45664; H01L 2224/45644; H01L 2924/2075; H01L 2924/20751; H01L 2924/20752; H01L 2924/20753; H01L 2924/20754; H01L 2924/20755; H01L 2924/20756; H01L 2924/20757; H01L 2924/20758
USPC ......................................................... 428/673
See application file for complete search history.

(56) References Cited

U.S. PATENT DOCUMENTS

| | | | |
|---|---|---|---|
| 10,960,498 B2 * | 3/2021 | Kang | ......................... C22C 5/06 |
| 2004/0014266 A1 | 1/2004 | Uno et al. | |
| 2007/0235887 A1 * | 10/2007 | Kaimori | .................. H01L 24/43 |
| | | | 257/784 |
| 2008/0289894 A1 * | 11/2008 | Muta | ..................... B60W 10/24 |
| | | | 180/248 |
| 2013/0171470 A1 | 7/2013 | Lee et al. | |
| 2015/0322586 A1 * | 11/2015 | Lyn | ........................... H01B 5/02 |
| | | | 428/613 |
| 2016/0315063 A1 * | 10/2016 | Uno | .......................... C22C 9/00 |
| 2017/0103823 A1 * | 4/2017 | Chuang | ..................... C22F 1/02 |
| 2017/0291033 A1 * | 10/2017 | Dittmer | ................. B23K 20/004 |
| 2020/0350273 A1 * | 11/2020 | Antoku | .................... H01L 24/45 |

FOREIGN PATENT DOCUMENTS

| | | | | |
|---|---|---|---|---|
| EP | 3118353 A1 * | 1/2017 | ............. | H01L 24/45 |
| JP | H01162343 A | 6/1989 | | |
| JP | 2002023618 A | 1/2002 | | |
| JP | 2005167020 A | 6/2005 | | |
| JP | 2012151350 A | 8/2012 | | |
| JP | 2016029691 A | 3/2016 | | |
| TW | 201541592 A | 11/2015 | | |
| WO | WO-2013018238 A1 | 2/2013 | | |
| WO | WO-2017091144 A1 | 6/2017 | | |

OTHER PUBLICATIONS

Someya, et al., The Effect of Some Kinds of Final Finishing Deposit on Wire Bonding Reliability, Surface Technology, 2015, 66:2:54-59 (Translation into English).
CA International Search Report issued in PCT/SG2017/000008 dated Nov. 21, 2017.

* cited by examiner

COATED WIRE

The invention relates to a coated wire comprising a silver or silver-based core and a coating layer superimposed on the surface of the core. The invention further relates to a process for manufacturing such coated wire.

The use of bonding wires in electronics and microelectronics applications is well-known state of the art. While bonding wires were made from gold in the beginning, nowadays less expensive materials are used such as copper, copper alloys, silver and silver alloys. Such wires may have a metal coating.

With respect to wire geometry, most common are bonding wires of circular cross-section and bonding ribbons which have a more or less rectangular cross-section. Both types of wire geometries have their advantages making them useful for specific applications.

It is an object of the invention to provide a coated silver or silver alloy wire suitable for use in wire bonding applications, the wire being outstanding in FAB (free air ball) formation, corrosion resistance and bonding performance but also exhibiting an overall well-balanced spectrum of properties which are relevant with regard to wire bonding applications including, for example, excellent reliability performance, improved bonded ball shape meeting ultra-fine pitch requirements, improved 2nd bond window, etc.

A contribution to the solution of said object is provided by the subject-matter of the category-forming claims. The dependent sub-claims of the category-forming claims represent preferred embodiments of the invention, the subject-matter of which also makes a contribution to solving the objects mentioned above.

In a first aspect, the invention relates to a wire comprising a wire core (hereinafter also called "core" for short) with a surface, the wire core having a coating layer superimposed on its surface, wherein the wire core itself consists of:
(a) pure silver consisting of (a1) silver in an amount in the range of from 99.99 to 100 wt.-% and (a2) further components (components other than silver) in a total amount of from 0 to 100 wt.-ppm or
(b) doped silver consisting of (b1) silver in an amount in the range of from >99.49 to 99.997 wt.-%, (b2) at least one doping element selected from the group consisting of calcium, nickel, platinum, palladium, gold, copper, rhodium and ruthenium in a total amount of from 30 to <5000 wt.-ppm and (b3) further components (components other than silver, calcium, nickel, platinum, palladium, gold, copper, rhodium and ruthenium) in a total amount of from 0 to 100 wt.-ppm,
or
(c) a silver alloy consisting of (c1) silver in an amount in the range of from 89.99 to 99.5 wt.-%, (c2) at least one alloying element selected from the group consisting of nickel, platinum, palladium, gold, copper, rhodium and ruthenium in a total amount in the range of from 0.5 to 10 wt.-% and (c3) further components (components other than silver, nickel, platinum, palladium, gold, copper, rhodium and ruthenium) in a total amount of from 0 to 100 wt.-ppm,
or
(d) a doped silver alloy consisting of (d1) silver in an amount in the range of from >89.49 to 99.497 wt.-%, (d2) at least one doping element selected from the group consisting of calcium, nickel, platinum, palladium, gold, copper, rhodium and ruthenium in a total amount of from 30 to <5000 wt.-ppm, (d3) at least one alloying element selected from the group consisting of nickel, platinum, palladium, gold, copper, rhodium and ruthenium in a total amount in the range of from 0.5 to 10 wt.-% and (d4) further components (components other than silver, calcium, nickel, platinum, palladium, gold, copper, rhodium and ruthenium) in a total amount of from 0 to 100 wt.-ppm,
wherein the at least one doping element (d2) is other than the at least one alloying element (d3),
wherein the individual amount of any further component is less than 30 wt.-ppm,
wherein the individual amount of any doping element is at least 30 wt.-ppm,
wherein all amounts in wt.-% and wt.-ppm are based on the total weight of the core, and
wherein the coating layer is a double-layer comprised of a 1 to 1000 nm inner layer (base layer) of gold and an adjacent 0.5 to 100 nm thick outer layer (top layer) of palladium or a double-layer comprised of a 0.5 to 100 nm thick inner layer of palladium and an adjacent >200 to 1000 nm thick outer layer of gold.

The wire of the invention is preferably a bonding wire for bonding in microelectronics. It is preferably a one-piece object. Numerous shapes are known and appear useful for wires of the invention. Preferred shapes are—in cross-sectional view—round, ellipsoid and rectangular shapes. For the invention, the term "bonding wire" comprises all shapes of cross-sections and all usual wire diameters, though bonding wires with circular cross-section and thin diameters are preferred. The average cross-section is in the range of for example from 50 to 5024 $\mu m^2$ or preferably 110 to 2400 $\mu m^2$; accordingly, in case of the preferred circular cross-sections, the average diameter is in the range of, for example, from 8 to 80 $\mu m$ or preferably 12 to 55 $\mu m$.

The average diameter or, simply stated, the diameter of a wire or wire core can be obtained by the "sizing method". According to this method the physical weight of the wire for a defined length is determined. Based on this weight, the diameter of a wire or wire core is calculated using the density of the wire material. The diameter is calculated as arithmetic mean of five measurements on five cuts of a particular wire.

In line with the aforementioned, the wire core consists of (a) pure silver, (b) doped silver, (c) a silver alloy, or (d) a doped silver alloy, in each case with the afore disclosed composition. The core of the wire of the invention may comprise so-called further components in a total amount in the range of from 0 to 100 wt.-ppm, for example 10 to 100 wt.-ppm. In the present context, the further components, often also referred as "inevitable impurities", are minor amounts of chemical elements and/or compounds which originate from impurities present in the raw materials used or from the wire manufacturing process. The low total amount of 0 to 100 wt.-ppm of the further components ensures a good reproducibility of the wire properties. Further components present in the core are usually not added separately. Each individual further component is comprised in an amount of less than 30 wt.-ppm, based on the total weight of the wire core.

The core of the wire is a homogeneous region of bulk material. Since any bulk material always has a surface region which might exhibit different properties to some extent, the properties of the core of the wire are understood as properties of the homogeneous region of bulk material. The surface of the bulk material region can differ in terms of morphology, composition (e.g. sulfur, chlorine and/or oxygen content) and other features. The surface is an interface region between the wire core and the coating layer superimposed on the wire core. Typically, the coating layer is completely superimposed on the wire core's surface. In the region of the wire between its core and the coating layer superimposed thereon a combination of materials of both, the core and the coating layer, can be present.

The coating layer superimposed on the surface of the wire is a double-layer comprised of a 1 to 1000 nm inner layer of gold and an adjacent 0.5 to 100 nm thick outer layer of palladium or a double-layer comprised of a 0.5 to 100 nm thick inner layer of palladium and an adjacent >200 to 1000 nm thick outer layer of gold. In this context the term "thick" or "coating layer thickness" means the size of the coating layer in perpendicular direction to the longitudinal axis of the core.

In an embodiment, the wire has a wire core diameter in the range of 10 to 25 µm and a coating layer in the form of said double-layer comprised of a 25 to 300 nm inner layer of gold and an adjacent 0.5 to 25 nm thick outer layer of palladium.

Concerning the composition of said double-layer, the palladium or gold content of its inner layer is, for example, at least 50 wt.-%, preferably at least 95 wt.-%, based on the total weight of the inner coating layer. Particularly preferred, the inner coating layer consists of pure palladium or of pure gold, respectively. The gold or palladium content of the adjacent outer gold or palladium layer is, for example, at least 50 wt.-%, preferably at least 95 wt.-%, based on the total weight of the outer coating layer. Particularly preferred, the outer coating layer consists of pure gold or pure palladium, respectively.

Pure gold or pure palladium usually has less than 1 wt.-% of further components (components other than gold or palladium, respectively), based on the total weight of the inner or outer coating layer.

In another aspect, the invention relates also to a process for the manufacture of the coated wire of the invention in any of its embodiments disclosed above. The process comprises at least the steps (1) to (5):
(1) providing a precursor item consisting of
(a) pure silver consisting of (a1) silver in an amount in the range of from 99.99 to 100 wt.-% and (a2) further components in a total amount of from 0 to 100 wt.-ppm
or
(b) doped silver consisting of (b1) silver in an amount in the range of from >99.49 to 99.997 wt.-%, (b2) at least one doping element selected from the group consisting of calcium, nickel, platinum, palladium, gold, copper, rhodium and ruthenium in a total amount of from 30 to <5000 wt.-ppm and (b3) further components in a total amount of from 0 to 100 wt.-ppm,
or
(c) a silver alloy consisting of (c1) silver in an amount in the range of from 89.99 to 99.5 wt.-%, (c2) at least one alloying element selected from the group consisting of nickel, platinum, palladium, gold, copper, rhodium and ruthenium in a total amount in the range of from 0.5 to 10 wt.-% and (c3) further components in a total amount of from 0 to 100 wt.-ppm,
or
(d) a doped silver alloy consisting of (d1) silver in an amount in the range of from >89.49 to 99.497 wt.-%, (d2) at least one doping element selected from the group consisting of calcium, nickel, platinum, palladium, gold, copper, rhodium and ruthenium in a total amount of from 30 to <5000 wt.-ppm, (d3) at least one alloying element selected from the group consisting of nickel, platinum, palladium, gold, copper, rhodium and ruthenium in a total amount in the range of from 0.5 to 10 wt.-% and (d4) further components in a total amount of from 0 to 100 wt.-ppm, wherein the at least one doping element (d2) is other than the at least one alloying element (d3),
wherein the individual amount of any further component is less than 30 wt.-ppm,
wherein the individual amount of any doping element is at least 30 wt.-ppm,
wherein all amounts in wt.-% and wt.-ppm are based on the total weight of the precursor item,
(2) elongating the precursor item to form an elongated precursor item, until an intermediate cross-section in the range of from 706 to 31400 µm$^2$ or an intermediate diameter in the range of from 30 to 200 µm is obtained,
(3) depositing a double-layer coating of an inner layer of palladium and an adjacent outer layer of gold or an inner layer of gold and an adjacent outer layer of palladium on the surface of the elongated precursor item obtained after completion of process step (2),
(4) further elongating the coated precursor item obtained after completion of process step (3) until a desired final cross-section or diameter is obtained, and
(5) finally strand annealing the coated precursor obtained after completion of process step (4) at an oven set temperature in the range of from 150 to 600° C. for an exposure time in the range of from 0.4 to 0.8 seconds to form the coated wire.

wherein step (2) may include one or more sub-steps of intermediate batch annealing of the precursor item at an oven set temperature of from 400 to 800° C. for an exposure time in the range of from 50 to 150 minutes.

The term "strand annealing" is used herein. It is a continuous process allowing for a fast production of a wire with high reproducibility. In the context of the invention, strand annealing means that the annealing is done dynamically while the coated precursor to be annealed is pulled or moved through a conventional annealing oven and spooled onto a reel after having left the annealing oven. Here, the annealing oven is typically in the form of a cylindrical tube of a given length. With its defined temperature profile at a given annealing speed which may be chosen in the range of, for example, from 10 to 60 meters/minute the annealing time/oven temperature parameters can be defined and set.

The term "oven set temperature" is used herein. It means the temperature fixed in the temperature controller of the annealing oven. The annealing oven may be a chamber furnace type oven (in case of batch annealing) or a tubular annealing oven (in case of strand annealing).

This disclosure distinguishes between precursor item, elongated precursor item, coated precursor item, coated precursor and coated wire. The term "precursor item" is used for those wire pre-stages which have not reached the desired final cross-section or final diameter of the wire core, while the term "precursor" is used for a wire pre-stage at the desired final cross-section or the desired final diameter. After completion of process step (5), i.e. after the final strand annealing of the coated precursor at the desired final cross-section or the desired final diameter a coated wire in the sense of the invention is obtained.

In the first alternative, the precursor item as provided in process step (1) consists of (a) pure silver of the afore disclosed composition. Typically, such precursor item is in the form of a rod having a diameter of, for example, 2 to 25 mm and a length of, for example, 2 to 100 m. Such silver rod can be made by continuous casting silver using an appropriate mold, followed by cooling and solidifying.

In the second to fourth alternative, the precursor item as provided in process step (1) consists of (b) doped silver or of (c) a silver alloy or of (d) a doped silver alloy, in each case of the afore disclosed composition. Such precursor items can be obtained by alloying, doping or alloying and doping silver with the desired amount of the required components. The doped silver or silver alloy or doped silver alloy can be prepared by conventional processes known to the person skilled in the art of metal alloys, for example, by melting together the components in the desired proportional ratio. In doing so, it is possible to make use of one or more conventional master alloys. The melting process can for example be performed making use of an induction furnace and it is expedient to work under vacuum or under an inert gas atmosphere. The materials used can have a purity grade of, for example, 99.99 wt.-% and above. The melt so-produced can be cooled to form a homogeneous piece of silver based precursor item. Typically, such precursor item is in the form of a rod having a diameter of, for example, 2 to 25 mm and a length of, for example, 2 to 100 m. Such rod can be made by continuous casting said doped silver or (doped) silver alloy melt using an appropriate mold, followed by cooling and solidifying.

In process step (2) the precursor item is elongated to form an elongated precursor item, until an intermediate cross-section in the range of from 706 to 31400 μm$^2$ or an intermediate diameter in the range of from 30 to 200 μm is obtained. Techniques to elongate a precursor item are known and appear useful in the context of the invention. Preferred techniques are rolling, swaging, die drawing or the like, of which die drawing is particularly preferred. In the latter case the precursor item is drawn in several process steps until the desired intermediate cross-section or the desired intermediate diameter is reached. Such wire die drawing process is well known to the person skilled in the art. Conventional tungsten carbide and diamond drawing dies may be employed and conventional drawing lubricants may be employed to support the drawing.

Step (2) of the process of the invention may include one or more sub-steps of intermediate batch annealing of the elongated precursor item at an oven set temperature in the range of from 400 to 800° C. for an exposure time in the range of from 50 to 150 minutes. Said optional intermediate batch annealing may be performed, for example, with a rod drawn to a diameter of 2 mm and coiled on a drum.

In process step (3) a double-layer coating comprised of an inner layer of palladium and an adjacent outer layer of gold or of an inner layer of gold and an adjacent outer layer of palladium is deposited on the surface of the elongated precursor item obtained after completion of process step (2) so as to superimpose the coating over said surface.

The skilled person knows how to calculate the thickness of such coating on an elongated precursor item to finally obtain the coating in the layer thickness disclosed for the embodiments of the wire, i.e. after finally elongating the coated precursor item. The skilled person knows numerous techniques for forming a coating layer of a material according to the embodiments on a silver or silver alloy surface. Preferred techniques are plating, such as electroplating and electroless plating, deposition of the material from the gas phase such as sputtering, ion plating, vacuum evaporation and physical vapor deposition, and deposition of the material from the melt. In the context of the invention electroplating is the preferred technique.

In process step (4) the coated precursor item obtained after completion of process step (3) is further elongated until the desired final cross-section or diameter of the wire is obtained. Techniques to elongate the coated precursor item are the same elongation techniques like those mentioned above in the disclosure of process step (2).

In process step (5) the coated precursor obtained after completion of process step (4) is finally strand annealed at an oven set temperature in the range of from 150 to 600° C., preferably 200 to 400° C. for an exposure time in the range of from 0.4 to 0.8 seconds to form the coated wire.

In a preferred embodiment, the finally strand annealed coated precursor, i.e. the still hot coated wire is quenched in water which, in an embodiment, may contain one or more additives, for example, 0.01 to 0.2 volume-% of additive(s). The quenching in water means immediately or rapidly, i.e. within 0.2 to 0.6 seconds, cooling the finally strand annealed coated precursor from the temperature it experienced in process step (5) down to room temperature, for example by dipping or dripping.

The optional intermediate batch annealing of process step (2) may be performed under an inert or reducing atmosphere. Numerous types of inert atmospheres as well as reducing atmospheres are known in the art and are used for purging the annealing oven. Of the known inert atmospheres, nitrogen or argon is preferred. Of the known reducing atmospheres, hydrogen is preferred. Another preferred reducing atmosphere is a mixture of hydrogen and nitrogen. Preferred mixtures of hydrogen and nitrogen are 90 to 98 vol.-% nitrogen and, accordingly, 2 to 10 vol.-% hydrogen, wherein the vol.-% total 100 vol.-%. Preferred mixtures of nitrogen/hydrogen are equal to 93/7, 95/5 and 97/3 vol.-%/vol.-%, each based on the total volume of the mixture.

After completion of process step (5) and the optional quenching the coated wire of the invention is finished. In order to fully benefit from its properties, it is expedient to either use it immediately for wire bonding applications, i.e. without delay, for example, within no longer than 28 days after completion of process step (5). Alternatively, in order to keep the wire's wide wire bonding process window property and in order to prevent it from oxidative or other chemical attack, the finished wire is typically spooled and vacuum sealed immediately after completion of process step (5), i.e. without delay, for example, within <1 to 5 hours after completion of process step (5) and then stored for further use as bonding wire. Storage in vacuum sealed condition should not exceed 12 months. After opening the vacuum seal the wire should be used for wire bonding within no longer than 28 days.

It is preferred that all process steps (1) to (5) as well as spooling and vacuum sealing are carried out under clean room conditions (US FED STD 209E cleanroom standards, 1 k standard).

A third aspect of the invention is a coated wire obtainable by the afore disclosed process according to any embodiment thereof. It has been found that the coated wire of the invention is well suited for use as a bonding wire in wire bonding applications. Wire bonding technique is well known to the skilled person. In the course of wire bonding it is typical that a ball bond (1$^{st}$ bond) and a stitch bond (2$^{nd}$ bond, wedge bond) are formed. During bond forming a certain force (typically measured in grams) is applied, supported by application of ultrasonic energy (typically measured in mA). The mathematical product of the difference between the upper and the lower limits of the applied force and the difference between the upper and the lower limits of the applied ultrasonic energy in a wire bonding process defines the wire bonding process window:

(Upper limit of applied force−Lower limit of applied force)−(Upper limit of applied ultrasonic energy−Lower limit of applied ultrasonic energy)=Wire bonding process window.

The wire bonding process window defines the area of force/ultrasonic energy combinations which allow formation of a wire bond that meets specifications, i.e. which passes the conventional tests like conventional pull tests, ball shear test and ball pull test to name only few.

EXAMPLES

Preparation of FAB:

It was worked according to the procedures described in the KNS Process User Guide for FAB (Kulicke & Soffa Industries Inc, Fort Washington, Pa., USA, 2002, 31 May 2009) in ambient atmosphere. FAB was prepared by performing conventional electric flame-off (EFO) firing by standard firing (single step, 17.5 μm wire, EFO current of 50 mA, EFO time 125 μs).

Test methods A. to C.

All tests and measurements were conducted at T=20° C. and a relative humidity RH=50%.

A. Salt-Solution Soaking Test of Bonded Balls:

The wires were ball bonded to Al-0.5 wt.-% Cu bond pads. The test devices with the so-bonded wires were soaked in salt-solution at 25° C. for 10 minutes, washed with deionized (DI) water and later with acetone. The salt-solution contained 20 wt.-ppm NaCl in DI water. The number of lifted balls were examined under a low power microscope (Nikon MM-40) at 100× magnification. Observation of a higher number of lifted balls indicated severe interfacial galvanic corrosion.

B. FAB Morphology

The formed FAB was examined by scanning electron microscope (SEM) with a magnification of 1000.

Evaluation:

++, very good (round ball)

+, good (round ball);

0, acceptable (not perfectly round, but no obvious plateau on the FAB surface);

−, peach ball (two plateaus with distinct hemisphere at FAB tip)

−−, severe peach ball (two plateaus with distinct hemisphere at FAB tip)

C. Off center ball (OCB) occurrence

The formed FAB descended to a Al—0.5 wt.-% Cu bond pad from a predefined height (tip of 203.2 μm) and speed (contact velocity of 6.4 μm/sec). Upon touching the bond pad, a set of defined bonding parameters (bond force of 100 g, ultrasonic energy of 95 mA and bond time of 15 ms) took into effect to deform the FAB and formed the bonded ball. After forming the ball, the capillary rose to a predefined height (kink height of 152.4 μm and loop height of 254 μm) to form the loop. After forming the loop, the capillary descended to the lead to form the stitch. After forming the stitch, the capillary rose and the wire clamp closed to cut the wire to make the predefined tail length (tail length extension of 254 μm). For each sample five bonded wires were optically inspected using a microscope with a magnification of 1000.

Evaluation:

++, perfect centered

+, centered;

0, acceptably off-centered;

−, off-centered;

−−, very off-centered.

Wire Examples 1 to 18

A quantity of silver (Ag) and, optionally, palladium (Pd) of at least 99.99% purity ("4N") in each case were melted in a crucible. In some cases small amounts of silver-nickel or silver-platinum master alloys were added to the melt and uniform distribution of the added components was ascertained by stirring. The following master alloys were used:

| Master Alloy | Composition | |
|---|---|---|
| Ag-0.5 wt.-% Ni | 99.5 wt.-% Ag | 0.5 wt.-% Ni |
| Ag-0.5 wt.-% Pt | 99.5 wt.-% Ag | 0.5 wt.-% Pt |

For the wire core alloys of Table 1 a corresponding combination of master alloys were added.

Then a wire core precursor item in the form of 8 mm rods was continuous cast from the melt. The rods were then drawn in several drawing steps to form a wire core precursor having a circular cross-section with a diameter of 134 μm. The wire core precursor was intermediate batch annealed at an oven set temperature of 500° C. for an exposure time of 60 minutes and thereafter further drawn to a final diameter of 17.5 μm, followed by a final strand annealing at an oven set temperature of 220° C. for an exposure time of 0.6 seconds, immediately followed by quenching the so-obtained coated wires in water containing 0.07 vol.-% of surfactant.

In case of reference wires 4 to 6 the wire core precursor was electroplated with a coating layer consisting of gold of at least 99% purity and thereafter further drawn to a final diameter of 17.5 μm and a final gold coating layer thickness of 250 nm, followed by a final strand annealing at an oven set temperature of 220° C. for an exposure time of 0.6 seconds, immediately followed by quenching the so-obtained coated wires in water containing 0.07 vol.-% of surfactant.

For the inventive wires 1 to 12, a double layer comprising gold and palladium was electroplated instead of a single gold layer as described above (final palladium layer thickness=5 nm, final gold layer thickness=250 nm). In some embodiments the palladium layer was plated first followed by an outer layer of gold, in other embodiments the gold layer was plated first followed by an outer layer of palladium.

By means of these procedures, several different samples 1 to 12 of double-coated silver or silver-based wires and uncoated and single-layer gold coated reference silver wires (Ref) were manufactured. Table 1 shows the composition of the wires.

TABLE 1

| Sample | Coating inner coating layer [nm] | Coating outer coating [nm] | wire core alloying/doping elements wt.-% Pd | wire core alloying/doping elements wt.-ppm Ni | wire core alloying/doping elements wt.-ppm Pt |
|---|---|---|---|---|---|
| 4N Ag (Ref 1) | none | None | 0.0002 | 2 | 2 |
| doped Ag (Ref 2) | none | None | 0.4 | 2 | 2 |
| Alloyed Ag (Ref 3) | none | None | 1.5 | 2 | 2 |
| 4N Ag (Ref 4) | none | gold [250 nm] | 0.0002 | 2 | 2 |
| doped Ag (Ref 5) | none | gold [250 nml | 0.4 | 2 | 2 |
| Alloyed Ag (Ref 6) | none | gold [250 nm] | 1.5 | 2 | 2 |
| 1 (invention) | gold [250 nm] | palladium [5 nm] | 0.0002 | 2 | 2 |
| 2 (invention) | gold [250 nm] | palladium [5 nm] | 0.4 | 2 | 2 |
| 3 (invention) | gold [250 nm] | palladium [5 nm] | 1.5 | 2 | 2 |
| 4 (invention) | gold [250 nm] | palladium [5 nm] | 0.0002 | 2 | 500 |
| 5 (invention) | gold [250 nm] | palladium [5 nm] | 0.4 | 40 | 2 |
| 6 (invention) | gold [250 nm] | palladium [5 nm] | 1.5 | 40 | 2 |
| 7 (invention) | palladium [5 nm] | gold [250 nm] | 0.0002 | 2 | 2 |
| 8 (invention) | palladium [5 nm] | gold [250 nm] | 0.4 | 2 | 2 |
| 9 (invention) | palladium [5 nm] | gold [250 nm] | 1.5 | 2 | 2 |
| 10 (invention) | palladium [5 nm] | gold [250 nm] | 0.0002 | 2 | 500 |
| 11 (invention) | palladium [5 nm] | gold [250 nm] | 0.4 | 40 | 2 |
| 12 (invention) | palladium [5 nm] | gold [250 nm] | 1.5 | 40 | 2 |

Table 2 below shows certain test results. All tests were carried out with wires of 17.5 μm diameter

TABLE 2

| | Ref 1 | Ref 2 | Ref 3 | Ref 4 | Ref 5 | Ref 6 | 1 | 2 | 3 | 4 | 5 | 6 | 7 | 8 | 9 | 10 | 11 | 12 |
|---|---|---|---|---|---|---|---|---|---|---|---|---|---|---|---|---|---|---|
| Salt-solution soaking test of bonded balls | 85 | 78 | 73 | 7 | 5 | 8 | 5 | 5 | 2 | 4 | 3 | 2 | 6 | 3 | 4 | 2 | 1 | 3 |
| FAB morphology | -- | -- | - | 0 | 0 | 0 | + | + | ++ | + | + | ++ | + | ++ | + | ++ | ++ | ++ |
| OCB occurrence | -- | -- | -- | - | - | 0 | + | + | ++ | + | + | ++ | ++ | ++ | ++ | ++ | ++ | ++ |

The invention claimed is:

1. A wire comprising a wire core with a surface, the wire core having a coating layer superimposed on its surface, wherein
the wire core consists of:
a silver alloy consisting of silver in an amount in the range of from 89.99 to 99.5 wt.-%, at least one alloying element selected from the group consisting of nickel, platinum, palladium, gold, copper, rhodium and ruthenium in a total amount in the range of from 0.5 to 10 wt.-% and further components in a total amount of from 0 to 100 wt.-ppm, or
a doped silver alloy consisting of silver in an amount in the range of from >89.49 to 99.497 wt.-%, at least one doping element selected from the group consisting of calcium, nickel, platinum, palladium, gold, copper, rhodium and ruthenium in a total amount of from 30 to <5000 wt.-ppm, at least one alloying element selected from the group consisting of nickel, platinum, palladium, gold, copper, rhodium and ruthenium in a total amount in the range of from 0.5 to 10 wt.-% and further components in a total amount of from 0 to 100 wt.-ppm, the at least one doping element being an element other than the at least one alloying element,
wherein the individual amount of any further component is less than 30 wt.-ppm,
wherein the individual amount of any doping element is at least 30 wt.-ppm,
wherein all amounts in wt.-% and wt.-ppm are based on the total weight of the core, and
the coating layer is a double-layer comprised of a 0.5 to 100 nm thick inner layer of palladium and an adjacent >200 to 1000 nm thick outer layer of gold.

2. The wire of claim 1, wherein the wire has an average cross-section in the range of 50 to 5024 μm².

3. The wire of claim 1, wherein the wire has a circular cross-section with an average diameter in the range of 8 to 80 μm.

4. The wire of claim 1, wherein the wire has a wire core diameter in the range of 10 to 25 μm.

5. A process for the manufacture of a coated wire according to claim 1, the process comprising:
(1) providing a precursor item consisting of:
a silver alloy consisting of silver in an amount in the range of from 89.99 to 99.5 wt.-%, at least one alloying element selected from the group consisting of nickel, platinum, palladium, gold, copper, rhodium and ruthenium in a total amount in the range of from 0.5 to 10 wt.-% and further components in a total amount of from 0 to 100 wt.-ppm, or
a doped silver alloy consisting of silver in an amount in the range of from >89.49 to 99.497 wt.-%, at least one doping element selected from the group consisting of calcium, nickel, platinum, palladium, gold, copper, rhodium and ruthenium in a total amount of from 30 to <5000 wt.-ppm, at least one alloying element selected from the group consisting of nickel, platinum, palladium, gold, copper, rhodium and ruthenium in a total amount in the range of from 0.5 to 10 wt.-% and further components in a total amount of from 0 to 100 wt.-ppm, the at least one doping element being an element other than the at least one alloying element, wherein the individual amount of any further component is less than 30 wt.-ppm, wherein the individual amount of any doping element is at least 30 wt.-ppm, and wherein all amounts in wt.-% and wt.-ppm are based on the total weight of the precursor item, (2) elongating the precursor item to form an elongated precursor item, until an intermediate cross-section in the range of from 706 to 31400 μm² or an intermediate diameter in the range of from 30 to 200 μm is obtained, (3) depositing a double-layer coating of an inner layer of palladium and an adjacent outer layer of gold on the surface of the elongated precursor item obtained in step (2) to form a coated precursor item, (4) further elongating the coated precursor item obtained in step (3) until a desired final cross-section or diameter is obtained, and (5) finally strand annealing the elongated coated precursor item obtained in step (4) at an oven set temperature in the range of from 150 to 600° C. for an exposure time in the range of from 0.4 to 0.8 seconds to form the coated wire, wherein step (2) may include one or more sub-steps of intermediate batch annealing of the precursor item at an oven set temperature of from 400 to 800° C. for an exposure time in the range of from 50 to 150 minutes.

6. The process of claim 5, wherein the final strand annealing is performed at an oven set temperature in the range of from 200 to 400° C.

7. The process of claim 5, wherein the finally strand annealed coated precursor is quenched in water.

8. The process of claim 5, wherein the optional intermediate batch annealing of process step (2) is performed in an inert atmosphere.

9. A coated wire obtainable by a process according to claim 5.

10. The process of claim 5, wherein the water contains one or more additives.

11. The process of claim 5, wherein the optional intermediate batch annealing of process step (2) is performed in a reducing atmosphere.

12. The wire of claim 1, wherein the at least one alloying element is palladium.

13. The wire of claim 12, wherein the at least one doping element is nickel or platinum.

14. The wire of claim 1, wherein the at least one doping element is nickel or platinum.

* * * * *